United States Patent [19]

Coker

[11] Patent Number: 5,329,535
[45] Date of Patent: Jul. 12, 1994

[54] VARIABLE BLOCK LENGTHS ON-THE-FLY ERROR CORRECTING DECODER

[75] Inventor: Jonathan D. Coker, Rochester, Minn.

[73] Assignee: International Business Machines Corporation, Armonk, N.Y.

[21] Appl. No.: 876,593

[22] Filed: Apr. 30, 1992

[51] Int. Cl.[5] .......................................... H03M 13/22
[52] U.S. Cl. .................................................... 371/39.1
[58] Field of Search ................... 371/37.1, 38.1, 39.1, 371/37.4

[56] References Cited

U.S. PATENT DOCUMENTS

| | | | |
|---|---|---|---|
| 4,494,234 | 1/1985 | Patel | 371/40.3 |
| 4,525,838 | 6/1985 | Patel | 371/37.4 |
| 4,584,686 | 4/1986 | Fritze | 371/37.1 |
| 4,649,541 | 3/1987 | Lahmeyuer | 371/37.1 |
| 4,706,250 | 11/1987 | Patel | 371/38.1 |
| 4,873,688 | 10/1989 | Maki et al. | 371/37.1 |
| 4,890,287 | 12/1989 | Johnson et al. | 371/37.2 |
| 4,907,233 | 3/1990 | Deutsch et al. | 371/37.4 |
| 4,916,701 | 4/1990 | Eggenberger et al. | 371/37.7 |
| 4,951,284 | 8/1990 | Abdel-Ghaffar et al. | 371/38.1 |
| 5,068,856 | 11/1991 | Nagasawa et al. | 371/37.5 |
| 5,107,503 | 4/1992 | Riggle et al. | 371/37.1 |
| 5,130,990 | 7/1992 | Hsu et al. | 371/37.1 |
| 5,268,908 | 12/1993 | Glover et al. | 371/37.1 |

OTHER PUBLICATIONS

I. S. Reed et al. "Polynomial Codes Over Certain Finite Fields." vol. 8, No. 2, pp. 300–304. J. Soc. Indust. Appl. Math. Jun. 1960.

*Primary Examiner*—Stephen M. Baker
*Attorney, Agent, or Firm*—Joan Pennington; Richard E. Billion; Pryor A. Garnett

[57] ABSTRACT

An ECC decoder is provided for use with variable block lengths of Reed-Solomon (RS) code for on-the-fly detecting of multiple errors and correction of one error byte per interleave in data recorded on a storage medium in blocks. Each data block includes variable length data subblocks equal to N*L, where N equals a variable number of bytes per interleave and L equals the interleave degree. The ECC decoder includes a delay register for sequentially receiving consecutive N*L data bytes of the data subblocks at a delay register data input and for sequentially transferring the consecutive N*L data bytes of data subblocks to a delay register data output. Each subblock contains a predetermined number of error check bytes M. Multiple M partial syndrome generators sequentially receive the consecutive subblocks of data and generate partial syndromes. The generated partial syndromes are compared to identify agreement. A first one of the multiple M partial syndrome generators is coupled to the delay register data output for selectively adding an error pattern to the transferred data subblock responsive to identified agreement of the partial syndromes.

6 Claims, 1 Drawing Sheet

VARIABLE BLOCK LENGTHS ON-THE-FLY ERROR CORRECTING DECODER

BACKGROUND OF THE INVENTION

1. Field of the Invention

This invention relates generally to error correcting systems and, more particularly, to an on-the-fly error checking and correction (ECC) system for variable block lengths.

2. Description of the Prior Art

The following references disclose basic and significant aspects of prior art error correcting systems:

1. I. S. Reed and G. Solomon, "Polynomial Codes Over Certain Finite Fields", J. Soc. Indust. Appl. Math, 8 (1960) p. 300–304;
2. U.S. Pat. No. 4,494,234 "On-The-Fly Multibyte Error Correcting System" by Arvind M. Patel;
3. U.S. Pat. No. 4,525,838 "Multibyte Error Correcting System Involving a Two-Level Code Structure" by Arvind M. Patel;
4. U.S. Pat. No. 4,706,250 "Method and Apparatus for Correcting Multibyte Errors Having Improved Two-Level Code Structure" by Arvind M. Patel;
5. U.S. Pat. No. 4,907,233 "VLSI Single-Chip (255,223) Reed-Solomon Encoder with Interleaver" by Leslie J. Deutsch et al.;
6. U.S. Pat. No. 4,916,701 "Method and System for Correcting Long Bursts of Consecutive Errors" by John S. Eggenberger et al.; and
7. U.S. Pat. No. 4,951,284 "Method and Means for Correcting Random and Burst Errors" by Khaled Abdel-Ghaffar et al.

Most data storage subsystems associated with modern information handling systems employ some type of error correction system in order to obtain cost effective design for high reliability and data integrity. The ability of the data processing system to retrieve data from the storage system, i.e., access time, is a well recognized measure of the efficiency of the overall storage system. In most data processing systems, the decoding time for the error correction code is a direct factor in the total access time. As the capacity of storage devices has increased, the need for increased reliability and availability has also increased. As a result, the time required to process soft errors by the error correcting system becomes a larger percentage of the total access time.

In direct access storage devices (DASD's), typical ECC schemes implement error correction in such a way that data flow is temporarily interrupted, while microcode routines examine the syndromes or partial syndromes and generate correction vectors. One advantage of a microcode implementation is flexibility. Variable block sizes are accommodated cheaply, and in a straightforward manner. However, typical microcode implementations are not fast enough to prevent additional disk revolutions when reading sequential data.

It is desirable to provide an ECC system that provides single burst on-the-fly correction of variable data block lengths with minimal hardware complexity and cost. It is further desirable to provide an improved ECC decoder that implements a Reed-Solomon (RS) code which can correct one byte per interleave and can detect multiple errors in the interleave.

SUMMARY OF THE INVENTION

It is an object of the present invention to provide an ECC decoder that can be effectively and efficiently configured for single burst error correction; to provide an ECC decoder that provides single burst on-the-fly correction of continuously variable block lengths using one partial syndrome generator per check byte of a Reed-Solomon (RS) code; and to provide an ECC decoder that overcomes many disadvantages of known ECC systems.

In brief, the objects and advantages of the present invention are achieved by an ECC decoder used with variable block lengths of Reed-Solomon (RS) code for on-the-fly detecting of multiple errors and correction of one error byte per interleave in data recorded on a storage medium in blocks. Each data block includes variable length data subblocks equal to N*L, where N equals a variable number of bytes per interleave and L equals the interleave degree. The ECC decoder includes a delay register for sequentially receiving consecutive N*L data bytes of the data subblocks at a delay register data input and for sequentially transferring the consecutive N*L data bytes of data subblocks at a delay register data output. Each subblock contains a predetermined number of error check bytes M. Multiple M partial syndrome generators sequentially receive the consecutive subblocks of data and generate partial syndromes. The generated partial syndromes are compared to identify agreement. A first one of the multiple M partial syndrome generators is coupled to the delay register data output for selectively adding an error pattern to the transferred data subblock responsive to identified agreement of the partial syndromes.

BRIEF DESCRIPTION OF THE DRAWINGS

The present invention together with the above and other objects and advantages may best be understood from the following detailed description of the embodiment of the invention illustrated in the drawing, wherein.

DETAILED DESCRIPTION OF THE PREFERRED EMBODIMENT

Figure 1:
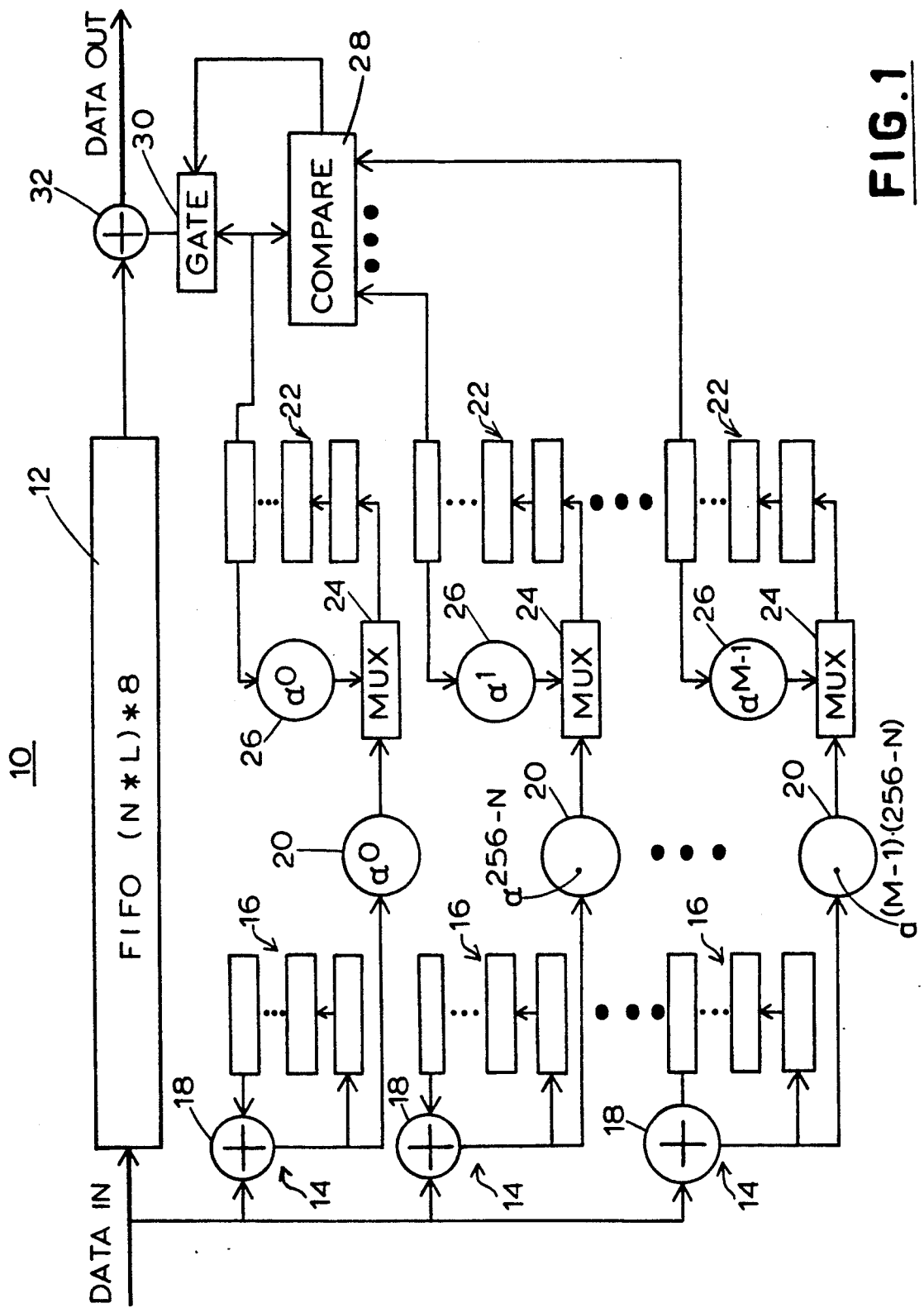
FIG. 1 is a block diagram representation of an ECC decoder arranged in accordance with principles of the present invention.

A block diagram of an ECC decoder of the invention generally designated by the reference character 10 is shown in FIG. 1. ECC decoder 10 is easily generalized, as shown, to accommodate any number of interleaves L, any number of check bytes per interleave M, and any number of bytes per interleave N up to the theoretical maximum.

ECC decoder 10 implements a Reed-Solomon (RS) code which corrects one byte or symbol per interleave and for a number of check bytes per interleave $M>2$, ECC decoder 10 utilizes the full error detection power of the code to detect multiple errors in the interleave. The delay of the ECC decoder 10 is equal to the subblock size (N*L bytes), where N equals the total number of bytes per interleave and L equals the interleave degree or level.

Operation of the ECC decoder 10 may be understood as follows. Data from the disk streams into the ECC decoder 10 input at a line labelled DATA IN. This data is applied to a delay first-in first-out (FIFO) (N*L)*8 register 12, and also is presented to M partial syndrome generators generally designated 14. A substantially uninterrupted stream of data enters and leaves the ECC decoder 10. The decoding process is considered on-thefly decoding because corrected data bytes of a previously received subblock are delivered to the user system at a line labelled DATA OUT while the data bytes of the following subblock are being received.

Each of the M partial syndrome generators 14 includes a first register ring which presents an instantaneous partial syndrome and includes L registers generally designated 16 coupled to a binary addition or exclusive-or (XOR) function 18. A corresponding programmable finite field multiplier 20 for each register ring 16 transfers the partial syndromes to a second L-register ring 22 through a multiplexer (MUX) 26 just in time for the input rings 16 to start generating partial syndromes for the next received subblock. A finite-field arithmetic function 26 is provided with each second L-register ring 22.

The need for the programmable multipliers 20 exists when the number of bytes per interleave is not equal to the theoretical maximum of usually 255 bytes for 8-bit bytes. Multipliers 20 simulate the effect of continuing to circulate the partial syndromes through the input rings 16 to the required maximum count (255). This feature allows the subblock to be any size up to the theoretical maximum. Multipliers 20 are easily changed on a real-time basis during a read operation to maximize format efficiency and need to be correct only when the output rings 22 are accepting data from the input rings 16.

When the delay FIFO register 12 begins clocking out the first subblock's data, the output rings 22 begin circulating at the same time. The top output ring 22 contains the error pattern when a single byte error occurs. All other syndromes must agree that the error occurred at a particular location; this is true when all inputs to the compare function 28 are equal. When this is true, the error pattern coupled by a gate 30 is added to the data byte by an addition function 32 and the single byte error correction is accomplished.

An error condition beyond the correction power of the ECC decoder 10 exists when not all of the partial syndromes are zero, and the compare function does not find agreement. Appropriate control logic (not shown) controls the FIFO 12 and MUX 24 selects, strips out ECC bytes when required, and flags a controller when an error beyond the correction power of the ECC decoder 10 is encountered. Additional simple control logic is required when the desired subblock size is not a multiple of the interleave level.

ECC decoder 10 corrects all single-burst errors of length L or less and no underrun condition can occur including when single-byte errors occur in all interleaves of all subblocks. It should be understood that tradeoffs with correction power and data delay versus format efficiency are easily enabled by varying the subblock size.

ECC decoder 10 can be further simplified by eliminating the programmable multipliers 20 when a data interface allows each subblock to be received in reverse order. This requirement has zero performance impact when the data is received in a disk cache, for example. The output ring arithmetic is based on the reciprocal polynomial of the input, causing the output rings to count backwards. Then the FIFO 12 becomes a subblock LIFO.

ECC decoder 10 can be implemented in approximately 5350 CMOS2 standard cells with L equal to 3 interleaves and M equal to 5 check bytes per interleave. Approximately 2800 cells are used for the FIFO memory 12 and approximately 1200 cells are used for the programmable finite field multipliers 20. The programmable finite field multipliers 20 can be eliminated with reversed data order.

The number of interleaves L and the number of check bytes per interleave M can be hard-wired for a particular product. However, these parameters can easily be made programmable using multiplexers for controlling the circulation of the partial syndromes and the compare function.

What is claimed and desired to be secured by Letters Patent of the United States is:

1. An ECC decoder used with variable block lengths for on-the-fly single burst correction comprising:

delay register means for sequentially receiving consecutive data subblocks at a delay register data input and for sequentially transferring said consecutive data subblocks to a delay register data output; each data subblock containing a predetermined number of error check bytes M; and said delay register means having a capacity equal to a subblock size of N*L bytes where N equals a maximum number of bytes per interleave and L equals an interleave level;

a plurality M of partial syndrome generator means for sequentially receiving consecutive subblocks of data and generating partial syndromes; where M equals said number of error check bytes; each of said plurality M of partial syndrome generator means including a programmable finite field multiplier;

compare means for comparing said generated partial syndromes;

a first one of said plurality M of partial syndrome generator means coupled to said delay register data output for selectively adding an error pattern to a transferred data subblock responsive to said compare means; and wherein each of said plurality M of partial syndrome generator means includes a first register ring and a second register ring, said first and second register rings including L registers, and said programmable finite field multiplier transfers a partial syndrome generated by said first register ring to said second register ring.

2. An ECC decoder as recited in claim 1 wherein an uncorrectable error is defined by at least one of said partial syndrome generator means generating a non-zero partial syndrome and non-agreement identified by said compare means.

3. An ECC decoder as recited in claim 1 wherein said programmable finite field multiplier simulates continued circulation of said generated partial syndrome for a predefined maximum count.

4. An ECC decoder as recited in claim 3 wherein said predefined maximum count equals 255, where a byte or symbol includes 8 bits.

5. An ECC decoder used with variable block lengths of Reed-Solomon (RS) code for on-the-fly detecting of multiple errors and correction of one error byte per interleave in data recorded on a storage medium in blocks, each data block including variable length data subblocks equal to N*L where N equals a variable number of bytes per interleave and L equals the interleave degree, said ECC decoder comprising:

delay register means for sequentially receiving consecutive N*L data bytes of said data subblocks at a delay register data input and for sequentially transferring said consecutive N*L data bytes of said data subblocks to a delay register data output; each data subblock containing a predetermined number of error check bytes M;

a plurality M of partial syndrome generator means for sequentially receiving consecutive subblocks of data and generating partial syndromes;

compare means for comparing said generated partial syndromes to identify agreement; and a first one of said plurality M of partial syndrome generator means coupled to said delay register data output for selectively adding an error pattern to a transferred data subblock responsive to identified agreement by said compare means; and wherein said each of said plurality M of partial syndrome generator means includes a first register ring and a second register ring, said first and second register rings including L registers, and wherein said delay register means transfers out consecutive N*L data bytes of said data subblocks at said delay register data output simultaneous with said second register ring.

6. An ECC decoder as recited in claim 5 wherein said each of said plurality M of partial syndrome generator means includes a real-time programmable finite field multiplier proportional with a multiplication factor in accordance with said variable number N of bytes per interleave.

* * * * *